US009712172B2

(12) United States Patent
Shauck et al.

(10) Patent No.: US 9,712,172 B2
(45) Date of Patent: Jul. 18, 2017

(54) DEVICES WITH AN ARRAY OF SUPERCONDUCTING LOGIC CELLS

(71) Applicant: Microsoft Technology Licensing, LLC, Redmond, WA (US)

(72) Inventors: Steven B. Shauck, Crofton, MD (US); Alexander Braun, Baltimore, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/877,550

(22) Filed: Oct. 7, 2015

(65) Prior Publication Data
US 2017/0104491 A1   Apr. 13, 2017

(51) Int. Cl.
| H03K 19/177 | (2006.01) |
| H03K 19/195 | (2006.01) |
| H03K 19/00 | (2006.01) |
| G06N 99/00 | (2010.01) |

(52) U.S. Cl.
CPC ......... H03K 19/195 (2013.01); G06N 99/002 (2013.01); H03K 19/0008 (2013.01); H03K 19/17708 (2013.01)

(58) Field of Classification Search
None
See application file for complete search history.

(56) References Cited

U.S. PATENT DOCUMENTS

| 4,672,244 | A  | * | 6/1987 | Harada | ................. | H03K 17/92 |
| | | | | | | 326/4 |
| 6,154,044 | A  | | 11/2000 | Herr | | |
| 6,242,939 | B1 | | 6/2001 | Nagasawa et al. | | |
| 6,518,786 | B2 | | 2/2003 | Herr | | |
| 6,870,395 | B2 | | 3/2005 | Schadt et al. | | |
| 7,724,020 | B2 | | 5/2010 | Herr | | |
| 7,786,748 | B1 | | 8/2010 | Herr | | |
| 7,969,178 | B2 | | 6/2011 | Przybysz et al. | | |
| 8,489,163 | B2 | | 7/2013 | Herr et al. | | |

(Continued)

FOREIGN PATENT DOCUMENTS

| CN | 203313163 U | 11/2013 |
| WO | 02069498 A2 | 9/2002 |

OTHER PUBLICATIONS

Fourie, et al., "An RSFQ Superconductive Programmable Gate Array", In Journal of IEEE Transactions on Applied Superconductivity, vol. 17, No. 2, Jun. 2007, pp. 538-541.

(Continued)

Primary Examiner — Douglas W Owens
Assistant Examiner — James H Cho
(74) Attorney, Agent, or Firm — Singh Law, PLLC; Ranjeev K. Singh

(57) ABSTRACT

A device including an array of superconducting logic cells, where each of the superconducting logic cells is configured to receive at least one input and provide at least one output, is provided. Each of the superconducting logic cells includes at least one Josephson junction, whose state changes based on at least a biasing condition caused by a phase of a first clock or a phase of a second clock. The array of the superconducting logic cells is configured to perform at least one operation based at least on a connection arrangement of the array of the superconducting logic cells.

20 Claims, 11 Drawing Sheets

(56) References Cited

U.S. PATENT DOCUMENTS

| | | | |
|---|---|---|---|
| 2008/0095110 A1* | 4/2008 | Montojo | H04L 5/0053 370/330 |
| 2009/0014714 A1* | 1/2009 | Koch | B82Y 10/00 257/31 |
| 2012/0184445 A1* | 7/2012 | Mukhanov | G11C 11/44 505/171 |
| 2015/0184286 A1 | 7/2015 | Barabash et al. | |

OTHER PUBLICATIONS

Oberg, Oliver Timothy, "Superconducting Logic Circuits Operating with Reciprocal Magnetic Flux Quanta", In a Dissertation, Jul. 27, 2015, 337 pages.

Dorojevets, et al., "Towards 32-bit Energy-Efficient Superconductor RQL Processors: The Cell-Level Design and Analysis of Key Processing and On-Chip Storage Units", In Journal of IEEE Transactions on Applied Superconductivity, vol. 25, No. 3, Jun. 2015, 8 pages.

Herr, et al., "Ultra-Low-Power Superconductor Logic", In Journal of Applied Physics, vol. 109, Issue 10, May 17, 2011, pp. 1-7.

Nishimoto, et al., "Design Method of Single-Flux-Quantum Logic Circuits Using Dynamically Reconfigurable Logic Gates", In Journal of IEEE Transactions on Applied Superconductivity, vol. 25, No. 3, Jun. 2015, 5 pages.

Semenov, et al., "New AC-Powered SFQ Digital Circuits", In Journal of IEEE Transactions on Applied Superconductivity, vol. 25, No. 3, Jun. 2015, 7 pages.

* cited by examiner

DEVICES WITH AN ARRAY OF SUPERCONDUCTING LOGIC CELLS

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption, at high clock speeds, by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, certain amount of power is wasted not only as a result of the requirement to maintain the state of the CMOS transistors, but also as a result of the current leakage.

An alternative approach to the use of processors, and related components, based on CMOS technology, is the use of superconducting logic based devices.

SUMMARY

In one example, the present disclosure relates to a device including a first clock terminal for receiving a first clock having a first phase and a second clock terminal for receiving a second clock having a second phase different from the first phase. The device may further include an array of superconducting logic cells, where each of the superconducting logic cells may be configured to receive at least one input and provide at least one output. Each of the superconducting logic cells may include at least one Josephson junction configured to change its state based on at least one of: (1) a first biasing condition caused by the first phase of the first clock or (2) a second biasing condition caused by the second phase of the second clock. In addition, each of the superconducting logic cells may be arranged in a pre-determined location in the array. A first set of the superconducting logic cells in the array of the superconducting logic cells may be configured to process at least a first set of inputs during the first phase of the first clock at least in response to the first biasing condition to generate a first set of outputs. A second subset of the superconducting logic cells in the array of superconducting logic cells may be configured to process at least a second set of inputs during the second phase of the second clock at least in response to the second biasing condition. The array of the superconducting logic cells may be configured to perform at least one operation by processing at least one of the first set of inputs and the second set of inputs. The at least one operation may be performed based on a connection arrangement of the array of superconducting cells, where with respect to connections with other superconducting logic cells in the array of the superconducting logic cells, each of the superconducting logic cells may be connected only to adjacent superconducting logic cells in the array of the superconducting logic cells.

In another aspect, the present disclosure relates to a device including: (1) a first clock terminal for receiving a first clock having a first phase, (2) a second clock terminal for receiving a second clock having a second phase different from the first phase, and (3) an input terminal for receiving a logic high signal. The device may further include an array of superconducting logic cells, where each of the superconducting logic cells may be configured to receive at least one input and provide at least one output. Each of the superconducting logic cells may include at least one Josephson junction configured to change its state based on at least one of: (1) a first biasing condition caused by the first phase of the first clock or (2) a second biasing condition caused by the second phase of the second clock. In addition, each of the superconducting logic cells may be arranged in a pre-determined location in the array. A first set of the superconducting logic cells in the array of the superconducting logic cells may be configured to process at least a first set of inputs during the first phase of the first clock at least in response to the first biasing condition to generate a first set of outputs. A second subset of the superconducting logic cells in the array of superconducting logic cells may be configured to process at least a second set of inputs during the second phase of the second clock at least in response to the second biasing condition. The array of the superconducting logic cells may be configured to perform at least one operation by processing at least one of the first set of inputs and the second set of inputs. The first set of inputs and the second set of inputs may include at least one of a plurality of inverted terms or a plurality of non-inverted terms. Based on a connection arrangement of the array of the superconducting logic cells, the plurality of the inverted terms may be combined using a logical OR operation and the plurality of the non-inverted terms and the logic high signal may be combined using a logical AND operation.

In yet another aspect, a method in a device including: (a) a first clock terminal for receiving a first clock having a first phase, (b) a second clock terminal for receiving a second clock having a second phase different from the first phase, (c) and an array of superconducting logic cells, where each of the superconducting logic cells may be configured to receive at least one input and provide at least one output, and where each of the superconducting logic cells comprises at least one Josephson junction configured to change its state based on at least one of: (1) a first biasing condition caused by the first phase of the first clock or (2) a second biasing condition caused by the second phase of the second clock, and where each of the superconducting logic cells is arranged in a pre-determined location in the array, is provided. The method may include processing, using a first subset of the superconducting logic cells in the array of superconducting logic cells, at least a first set of inputs during the first phase of the first clock based in response to the first biasing condition to generate a first set of outputs. The method may further include processing, using a second subset of the superconducting logic cells in the array of superconducting logic cells, at least a second set of inputs during the second phase of the second clock in response to the second biasing condition. The method may further include performing at least one logical operation by processing at least one of the first set of inputs and the second set of inputs, where the first set of inputs and the second set of inputs may include at least one of a plurality of inverted terms or a plurality of non-inverted terms, and where the performing the at least one logical operation may further include combining the plurality of inverted terms using at least one OR gate and combining the plurality of non-inverted terms using at least one AND gate to generate at least one product term. The method may further include outputting the at least one product term using at least one AanB gate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
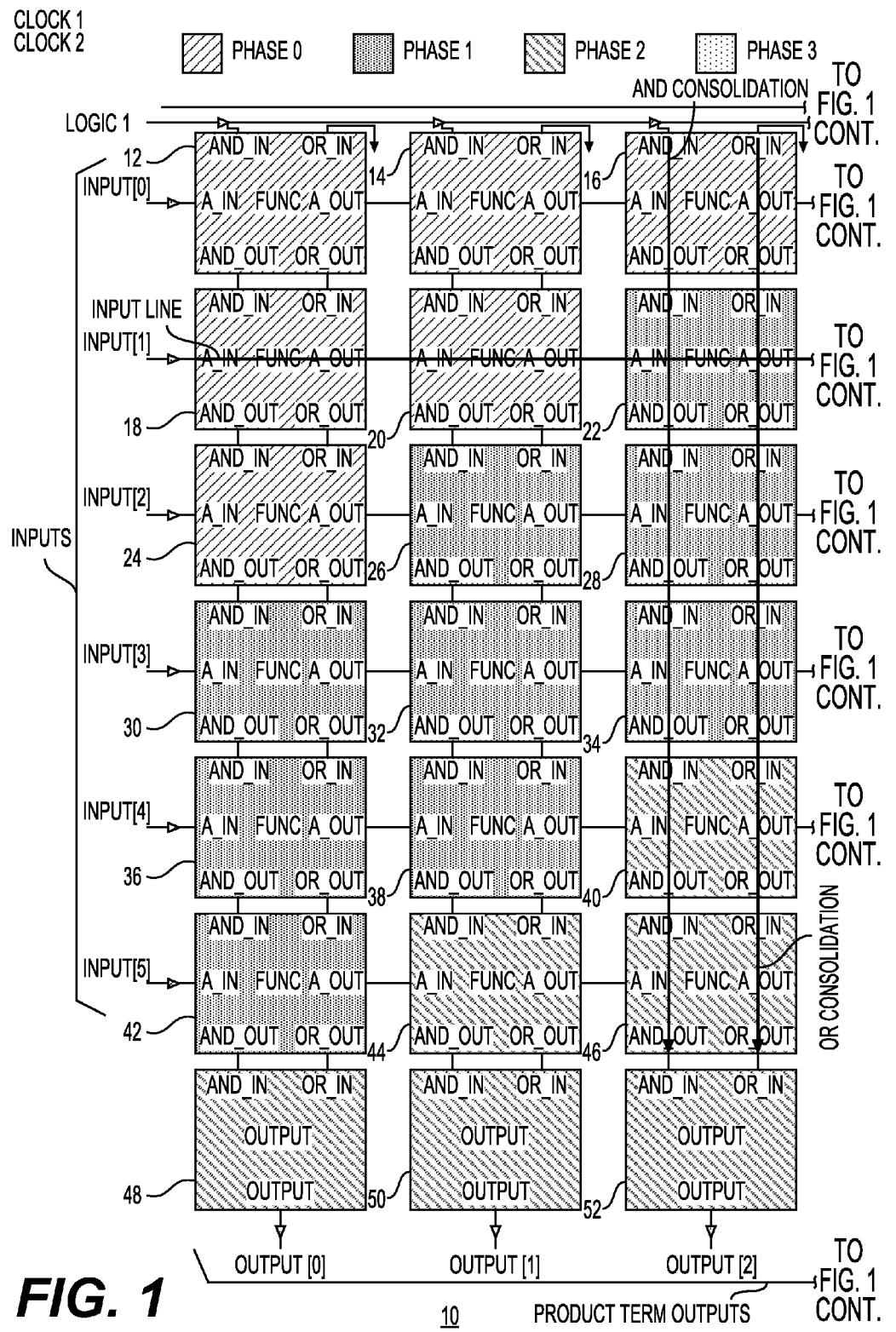
FIG. 1 is a block diagram of a device, including superconducting logic cells, for performing an operation in accordance with one example.
Figure 1:
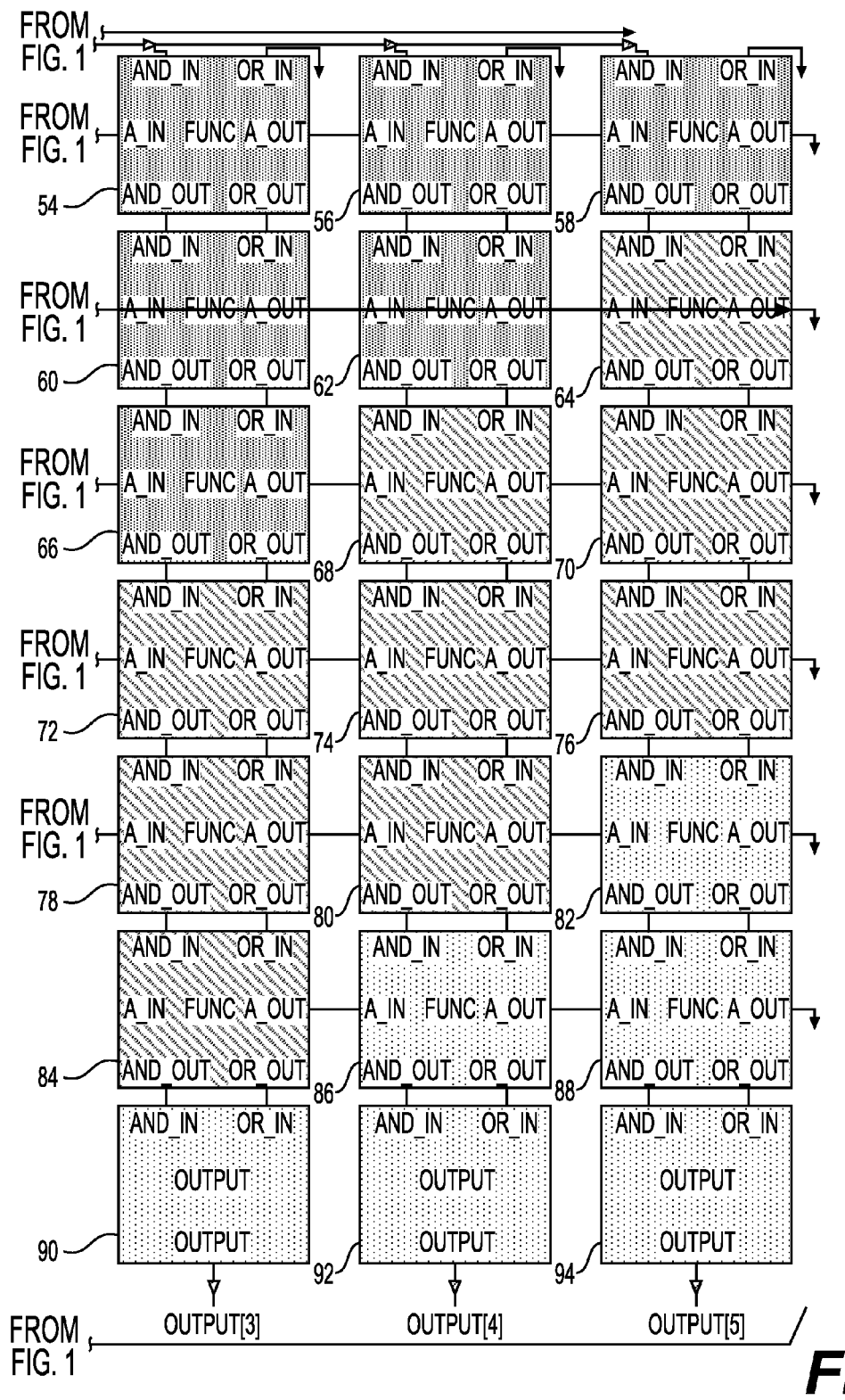

Examples described in this disclosure relate to superconducting logic based programmable devices, such as programmable logic arrays, decoders, and other processing components. Certain examples further relate to reciprocal quantum logic (RQL) based programmable devices. Such RQL based programmable devices may include RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance. Exemplary superconductors, such as Niobium has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates, include an AND gate, an OR gate, a logical A-and-not-B (AanB) gate and a logical AND/OR gate. The AanB gate may have two inputs and one output (Q). An input pulse A may propagate to output Q when favorable clock conditions may be present on an output Josephson transmission line (JTL), unless an input pulse B comes first with respect to either input pulse A or the favorable clock conditions on the output JTL. In some instances, if the input pulse B arrives after the input pulse A, but before the favorable clock conditions at the output JTL, the input pulse A may appear to propagate through the AanB gate; but may be suppressed before favorable clock conditions allow it to propagate. The AND/OR gate may have two inputs and two outputs (Q1 and Q2). The first input pulse, input pulse A or input pulse B goes to output Q1 and the second input pulse goes to output Q2. The logical behavior of these gates is based on the reciprocal data encoding mentioned earlier. As an example, a positive pulse changes the internal flux state of the inductive loop, but the trailing negative pulse erases the internal state every clock cycle, which in turn produces combinational logic behavior.

FIG. 1 is a block diagram of an exemplary device 10, including superconducting logic cells, for performing an operation in accordance with one example. Device 10 may have several superconducting logic cells, including, for example, superconducting logic cells 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, and 94. In one example, these cells may be arranged in an array including multiple rows and columns. Each superconducting cell may be configured to receive at least one input and provide at least one output. Device 10 may further include a clock terminal for receiving CLOCK 1 and another clock terminal for receiving CLOCK 2. These clocks may be two AC power lines, such that these may provide both power and clocking to device 10. Device 10 may further include control terminals for receiving control signals. Device 10 may be used as part of a decoder for decoding instructions in an instruction decoder or as part of a programmable logic array to realize other functions.

With continued referenced to FIG. 1, device 10 may be used to calculate product terms, which are the logical AND of a number of input terms. Each of the input terms may be inverted terms or non-inverted terms. For example, an arbitrary product term may equal $a \cdot \overline{b} \cdot c \cdot \overline{d} \cdot \overline{e}$ where a and c are non-inverted input terms and $\overline{b}$ $\overline{d}$ and $\overline{e}$ are inverted input terms. The product term may further be expressed as $(a \cdot c) \cdot (\overline{b} \cdot \overline{d} \cdot \overline{e})$. This restructuring of the product term may be realized using the associative property of the logical AND operation. Then, DeMorgan's law may be used on the grouped inverted terms to allow a single inversion to replace all of the individual ones, resulting in the product term expressed as $(a \cdot c) \cdot \overline{(b+d+e)}$. In this example, the resulting equation includes a single inversion as part of an AanB operation and the two sub-terms, the non-inverted sub-term consisting of AND operations and the inverted sub-term consisting of OR operations. AND gates may be used to perform a logical AND operation on the non-inverted terms (e.g., $(a \cdot c)$). OR gates may be used to perform a logical OR operation on the inverted terms (e.g., $\overline{(b+d+e)}$). The product term may then be obtained by feeding the combined terms to an AanB (A and not B) gate to generate the complete product term (e.g., $(a \cdot c) \cdot \overline{(b+d+e)}$). Due to the nature of the AanB gate, a logic 1 term is added to this equation. This is because, in one example RQL implementation of the AanB gate, the B input of the AanB gate is only capable of selectively blocking an SFQ pulse arriving at the A input from reaching the output. The additional logic 1 term may ensure that there is a pulse available to generate an output in case where the product term consists entirely of inverted inputs. The addition of the logic 1 term results in a product term with the equation: $(a \cdot c \cdot 1) \cdot \overline{(b+d+e)}$. Although a specific product term is described, any arbitrary product term may be processed using an array, such as the one shown in FIG. 1.

Still referring to FIG. 1, a product term ((e.g., $(a \cdot c \cdot 1) \cdot \overline{(b+d+e)}$)) may be generated using device 10. In one example, each superconducting logic cell may be one of three types of tiles or it may be an output logic cell. The superconducting logic cells labeled with FUNC may be one of three types of tiles: A, NOT_A, or PASS. These tiles may implement AND and OR functions of the sub-terms. Each of these tiles may accept an input on the left (INPUTS) and repeat the input to the right to allow multiple columns to be daisy chained to produce multiple product terms from the same set of inputs. The tiles labeled OUTPUT (e.g., 48, 50, 52, 90, 92, and 94) may implement the AanB (or AND NOT) portion of the product term. In each column of the array of tiles of device 10, lines consisting of Josephson Transmission Line (JTL) elements may be arranged vertically down the column. One line (labeled the AND CONSOLIDATION line) may be used to generate the non-inverted sub-term (e.g., $a \cdot c \cdot 1$) and the other line (labeled OR CONSOLIDATION line) may be used to generate the inverted sub-term (e.g., $\overline{(b+d+e)}$). At each intersection point where the input line for a row intersects the column for a product term, the appropriate tile may be placed during design of the array for device 10. As an example, for a non-inverted input, the A type of tile may be used to perform a logical AND operation with the AND CONSOLIDATION line and repeat both the input and OR CONSOLIDATION line signals unmodified. For an inverted input, the NOT_A type of tile may be used to perform a logical OR operation with the OR CONSOLIDATION line and repeat both the input and AND CONSOLIDATION line signals unmodified. For an input that does not appear in the product term, the PASS type of tile may be used to simply repeat the input signal to the right unmodified, and may also repeat signals on both the AND CONSOLIDATION line and the OR CONSOLIDATION line unmodified.

Still referring to FIG. 1, in the example of device 10, these tiles, including the output tiles, may be connected via abutment. In one example, connection via abutment may require that the connection does not add additional inductance that could interfere with the functioning of the RQL circuits. This may advantageously require no custom interconnect wiring and thus simplify the interconnections among the various tiles. The tiles may be routed and placed and then connected via abutment. As part of the layout of device 10, the tiles that need to be connected via abutment may be specified. During the manufacture of device 10, using a suitable process, the layout information may be translated into placement of specific tiles and into connections via abutments between adjacent tiles.

As shown in FIG. 1, inputs (one per row), such as INPUT[1], INPUT[2], INPUT[3], INPUT[4], and INPUT[5] are provided on the left side of the array. Each column of tiles may produce one product term with the output at the bottom of the array of tiles. According to one example, device 10 includes a product term array with six inputs and six outputs. The tiles may process inputs and outputs of the other tiles during four phases (PHASE 0 corresponding to 0 degree, PHASE 1 corresponding to 90 degrees, PHASE 2 corresponding to 180 degrees, and PHASE 3 corresponding to 270 degrees). Thus, for example, during PHASE 0, superconducting logic cells 12, 14, 16, 18, 20, and 24 may process positive pulse inputs to them and generate outputs from left to right and top to bottom. During PHASE 2, these cells may process the negative pulses (e.g., the negative pulses trailing the positive pulses) and these negative pulses may reset the circuits in these cells. During PHASE 1, superconducting logic cells 22, 26, 28, 30, 32, 34, 36, 38, 42, 54, 56, 58, 60, 62, and 66 may process inputs to generate outputs from left to right and top to bottom. During PHASE 3, these cells may process the negative pulses (e.g., the negative pulses trailing the positive pulses) and these negative pulses may reset the circuits in these cells. During PHASE 2, superconducting logic cells 40, 44, 46, 68, 70, 72, 74, 76, 78, 80, and 84 may process inputs to generate outputs from left to right and top to bottom. During PHASE 0, these cells may process the negative pulses (e.g., the negative pulses trailing the positive pulses) and these negative pulses may reset the circuits in these cells. Also, during PHASE 2, superconducting logic cells 48, 50, and 52 may provide outputs labeled OUTPUT[0], OUTPUT[1], and OUTPUT[2]. During PHASE 0, these cells may process the negative pulses (e.g., the negative pulses trailing the positive pulses) and these negative pulses may reset the circuits in these cells. During PHASE 3, superconducting logic cells 82, 86, and 88, may process inputs to generate outputs from left to right and top to bottom. During PHASE 1, these cells may process the negative pulses (e.g., the negative pulses trailing the positive pulses) and these negative pulses may reset the circuits in these cells. Also, during PHASE 3, superconducting logic cells 90, 92, and 94 may provide outputs labeled OUTPUT[3], OUTPUT[4], and OUTPUT[5]. The four phases may be derived from the two clocks: CLOCK 1 and CLOCK 2, which may also serve as AC power lines. CLOCK 1 and CLOCK 2 may have a phase difference of 90 degrees. In one example, cross-wired transformers (not shown) may be used to produce a four-phase clock from the two AC power lines. For example, by coupling the clock lines to the Josephson junctions in the gates of a respective superconducting cell in a wound or counter-wound fashion, four phases of clock may be derived. The four phases of the clock may provide directionality to the SFQ pulses. Thus, as an example, with respect to a four-phase clock, the positive pulse may ride the leading edge of the clock from one phase to the next and arrive at the output after one cycle of delay and the negative pulse may follow with half a cycle of separation. Although FIG. 1 illustrates the operation of device 10 with a four-phase clock, device 10 may operate with higher number of phase clocks, e.g., an eight-phase clock (PHASE 0 corresponding to 0 degree, PHASE 1 corresponding to 45 degrees, PHASE 2 corresponding to 90 degrees, PHASE 3 corresponding to 135 degrees, PHASE 4 corresponding to 180 degrees, PHASE 5 corresponding to 225 degrees, PHASE 6 corresponding to 270 degrees, and PHASE 7 corresponding to 315 degrees). In addition, device 10 may also operate with a six-phase clock (PHASE 0 corresponding to 0 degree, PHASE 1 corresponding to 60 degrees, PHASE 2 corresponding to 120 degrees, PHASE 3 corresponding to 180 degrees, PHASE 4 corresponding to 240 degrees, PHASE 5 corresponding to 300 degrees. In this example, the gates of device 10 may be reset two phases after the respective gates process any inputs. In other words, the reset need not occur in response to a negative pulse trailing a positive pulse, but may occur during a later phase.

Although FIG. 1 shows a certain number of components of device 10 arranged in a certain manner, there could be more or fewer number of components arranged differently. As an example, although not shown, the AC power may be distributed to device 10 via microwave components, such as power splitters, matching networks, and phase shifters. Advantageously, the integration of RQL circuits and gates with such components may result in low power dissipation.

Figure 2:
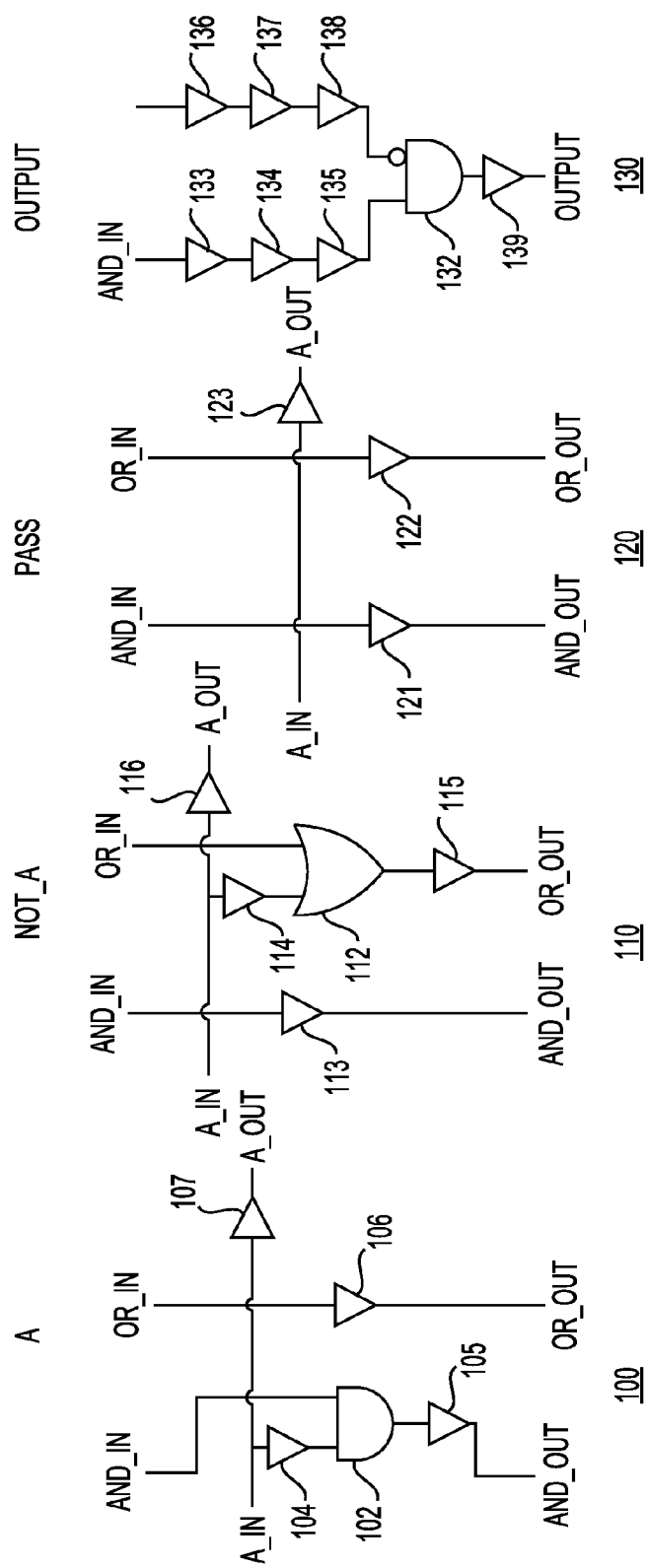
FIG. 2 shows schematic diagrams of different types of tiles of superconducting logic cells in accordance with one example.

FIG. 2 shows schematic diagrams of different types of tiles of superconducting logic cells in accordance with one example. A tile 100 may be used to perform a logical AND operation on two inputs (e.g., A_IN and AND_IN). A tile 100 may include an AND gate 104 and Josephson transmission line (JTL) elements, such as 104 and 105. A tile 100 may also include another JTL element 106 between the OR_IN input and the OR_OUT output. In addition, any signals arriving at the tile from the left via the A_IN input may be passed to the right of the tile via the A_OUT output. JTL element 107 may be provided between the A_IN input and the A_OUT output. The JTL elements may include Josephson junctions (JJs). In one example, there may be an even number of JJs in the JTL elements. They may be used to propagate SFQ pulses. Although FIG. 2 shows a certain number of components of tile 100 arranged in a certain manner, there could be more or fewer number of components arranged differently. For example, to meet certain timing requirements, if needed, A tile 100 may include additional or fewer JTL elements.

With continued reference to FIG. 2, NOT_A tile 110 may be used to perform a logical OR operation on two inputs (e.g., A_IN and OR_IN). NOT_A tile 110 may include an OR gate 112 and Josephson transmission line (JTL) elements, such as 114 and 115. NOT_A tile 110 may also include another JTL element 113 between the AND_IN input and the AND_OUT output. In addition, any signals arriving at the tile from the left via the A_IN input may be passed to the right of the tile via the A_OUT output. JTL element 116 may be provided between the A_IN input and the A_OUT output. The JTL elements may include Josephson junctions (JJs). They may be used to propagate SFQ pulses. Although FIG. 2 shows a certain number of components of NOT_A tile 110 arranged in a certain manner, there could be more or fewer number of components arranged differently. For example, to meet certain timing requirements, if needed, NOT_A tile 110 may include additional or fewer JTL elements.

Still referring to FIG. 2, PASS tile 120 may be used to pass a signal input at A_IN input to the right at A_OUT output without modifying the signal. PASS tile 120 may include Josephson transmission line (JTL) elements, such as 121, 122, and 123. PASS tile 120 may also simply allow signals received at the AND_IN input to pass through to the AND_OUT output. In addition, any signals arriving at the tile via the OR_IN input may be passed to the OR_OUT output. The JTL elements may include Josephson junctions (JJs). They may be used to propagate SFQ pulses. Although FIG. 2 shows a certain number of components of PASS tile 120 arranged in a certain manner, there could be more or fewer number of components arranged differently. For example, to meet certain timing requirements, if needed, PASS tile 120 may include additional or fewer JTL elements.

With continued reference to FIG. 2, OUTPUT tile 130 may be used to generate outputs of the array of device 10; for example, as superconducting logic cells 48, 50, 52, 90, 92, and 94 of FIG. 1. OUTPUT tile 130 may include Josephson transmission line (JTL) elements, such as 133, 134, 135, 136, 137, 138, and 139. The two inputs to OUTPUT tile 130 may include SFQ pulses arriving via AND_IN input and OR_IN input. These signals may be coupled to respective inputs of an AanB gate 132. AanB gate may implement AND NOT function. An input pulse received at AND_IN input may propagate to output Q, when favorable clock conditions may be present on JTL 139 element (or additional JTL elements at the output (not shown)), unless an input pulse at OR_IN input comes first with respect to either input pulse A or the favorable clock conditions on the output JTL element 139. [The JTL elements may include Josephson junctions (JJs). They may be used to propagate SFQ pulses. Although FIG. 2 shows a certain number of components of OUTPUT tile 130 arranged in a certain manner, there could be more or fewer number of components arranged differently. For example, to meet certain timing requirements, if needed, OUTPUT tile 130 may include additional or fewer JTL elements. The number of JTL elements coupled to the input of AanB gate 132 may be selected to ensure that the inputs to this gate arrive always at a phase boundary. This may ensure proper timing of arrival of inputs to AanB gate 132. At the phase boundary—where junctions may be coupled to a clock line with a different phase—early pulses may need to wait until the rise of the clock signal in the next phase. Similarly, the other components of OUTPUT tile 130 may be selected to ensure that the output SFQ pulses also are generated at a phase boundary. This may result in the SFQ pulses synchronizing themselves at output tiles with the respective AC power clock.

Figure 3:
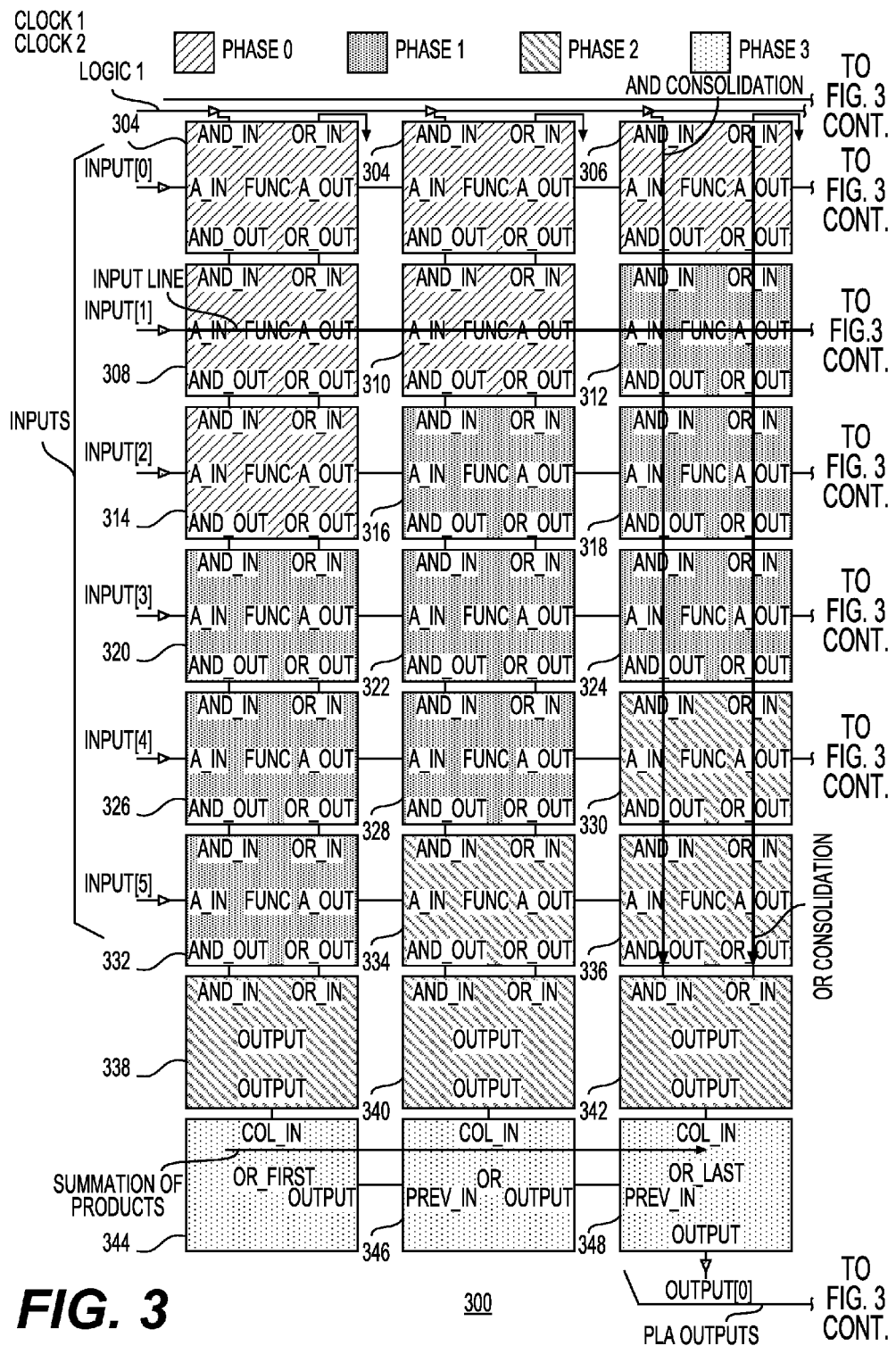
FIG. 3 is a block diagram of a device, including superconducting logic cells, for performing an operation in accordance with one example.
Figure 3:
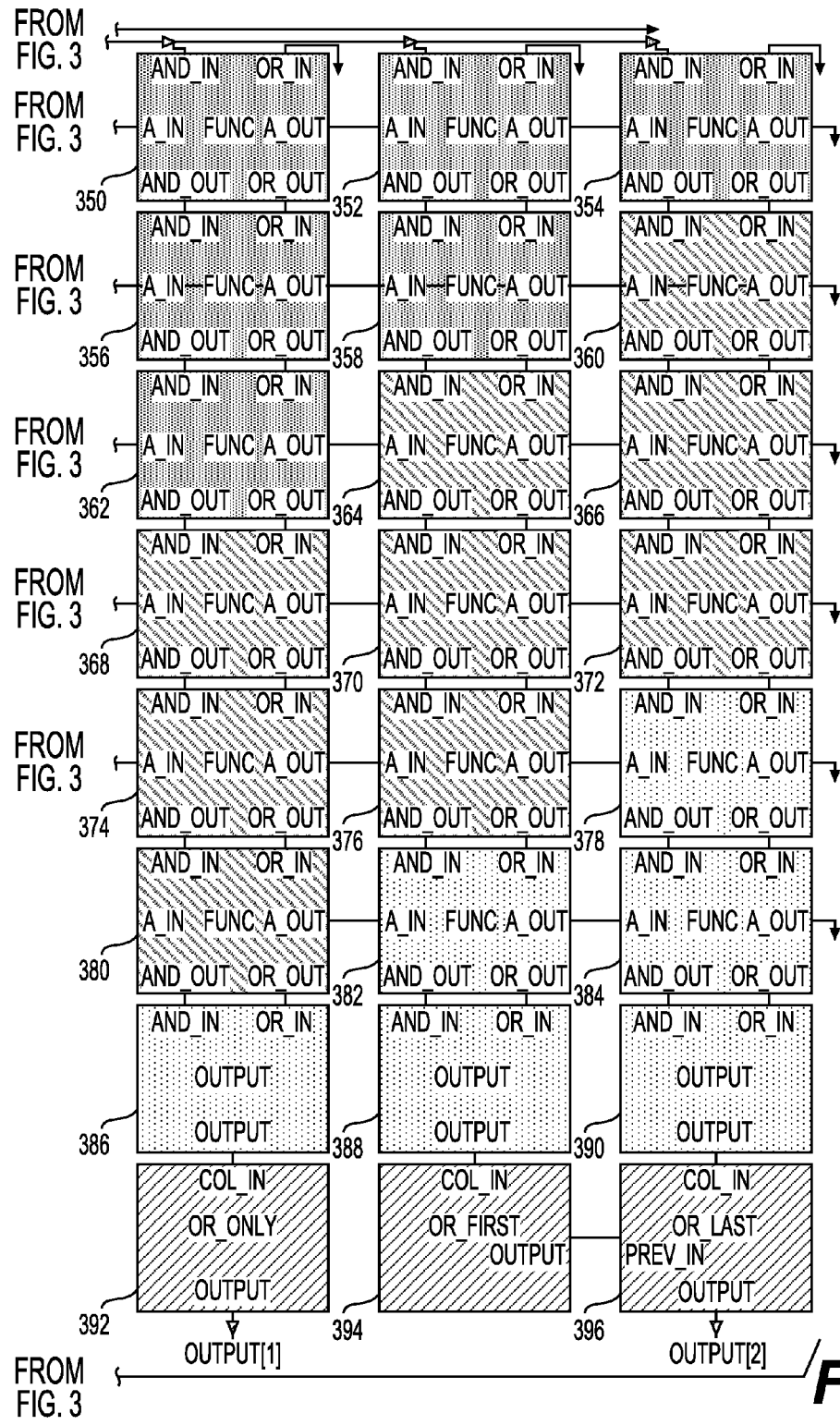

FIG. 3 is a block diagram of a device 300, including superconducting logic cells, for performing an operation in accordance with one example. Device 300 may have several superconducting logic cells, including, for example, superconducting logic cells 302, 304, 306, 308, 310, 312, 314, 316, 318, 320, 322, 324, 326, 328, 330, 332, 334, 336, 338, 340, 342, 344, 346, 348, 350, 352, 354, 356, 358, 360, 362, 364, 366, 368, 370, 372, 374, 376, 378, 380, 382, 384, 386, 388, 390, 392, 394, and 396. In one example, like device 10 of FIG. 1, these cells may be arranged in an array including multiple rows and columns. Each superconducting cell may be configured to receive at least one input and provide at least one output. Device 300 may further include a clock terminal for receiving CLOCK 1 and another clock terminal for receiving CLOCK 2. These clocks may be two AC power lines, such that these may provide both power and clocking to device 300. Device 300 may further include control terminals for receiving control signals. Device 300 may be used as part of a decoder for decoding instructions in an instruction decoder or as part of a programmable logic array to realize other functions.

With continued referenced to FIG. 3, device 300 may be used to calculate sum of product terms, which are the sum of logical AND of a number of input terms. The product terms may be calculated in a similar manner as described with respect to FIG. 1. In one example, the product terms (e.g., $(a \cdot c \cdot 1) \cdot \overline{(b+d+e)}$ and other product terms generated using superconducting logic cells similar to the ones described in FIG. 1) may be summed using superconducting logic cells 344, 346, 348, 392, 394, and 396.

As shown in FIG. 3, similar to device 10 of FIG. 1, inputs (one per row), such as INPUT[1], INPUT[2], INPUT[3], INPUT[4], and INPUT[5] are provided on the left side of the array. Each column of tiles may produce one product term with the output at the bottom of the array of tiles. The output product terms may then be summed up (SUMMATION OF PRODUCTS) using the bottom-most tiles of device 300. According to one example, device 300 includes a product term array with six inputs and six outputs and a row of superconducting logic cells at the bottom to generate a sum of the product terms. The tiles may process inputs and outputs of the other tiles during four phases (PHASE 0 corresponding to 0 degree, PHASE 1 corresponding to 90 degrees, PHASE 2 corresponding to 180 degrees, and PHASE 3 corresponding to 270 degrees). Thus, for example, during PHASE 0, superconducting logic cells 302, 304, 306, 308, and 310 may process inputs (e.g., positive pulses) to them and generate outputs from left to right and top to bottom. During PHASE 2, these cells may process the negative pulses (e.g., the negative pulses trailing the positive pulses) and these negative pulses may reset the circuits in these cells. During PHASE 1, superconducting logic cells 312, 316, 318, 320, 322, 324, 326, 328, 332, 350, 352, 356, 358, and 362 may process inputs (e.g., positive pulses) to generate outputs from left to right and top to bottom. During PHASE 3, these cells may process the negative pulses (e.g., the negative pulses trailing the positive pulses) and these negative pulses may reset the circuits in these cells. During PHASE 2, superconducting logic cells 330, 334, 336, 364, 366, 368, 370, 372, 374, 376, and 380 may process inputs (e.g., positive pulses) to generate outputs from left to right and top to bottom. During PHASE 0, these cells may process the negative pulses (e.g., the negative pulses trailing the positive pulses) and these negative pulses may reset the circuits in these cells. Also, during PHASE 2 superconducting logic cells 338, 340, and 342 may generate outputs (e.g., product terms). During PHASE 0, these cells may process the negative pulses (e.g., the negative pulses trailing the positive pulses) and these negative pulses may reset the circuits in these cells. During PHASE 3, superconducting logic cells 378, 382, and 384 may process inputs (e.g., positive pulses) to generate outputs from left to right and top to bottom. During PHASE 1, these cells may process the negative pulses (e.g., the negative pulses trailing the positive pulses) and these negative pulses may reset the circuits in these cells. Also, during PHASE 3 superconducting logic cells 386, 388, and 390 may generate outputs (e.g., product terms). During PHASE 1, these cells may process the negative pulses (e.g., the negative pulses trailing the positive pulses) and these negative pulses may reset the circuits in these cells. In addition, during PHASE 3, superconducting logic cells 344, 346, and 348 may process product terms to generate sum of the product terms generated by the first three columns of the array of cells of device 300. During PHASE 1, these cells may process the negative pulses (e.g., the negative pulses trailing the positive pulses) and these negative pulses may reset the circuits in these cells. Moreover, during PHASE 0, superconducting logic cells 392, 394, and 396 may process product terms to generate sum of the product terms generated by the last three columns of the array of cells of device 300. During PHASE 2, these cells may process the negative pulses (e.g., the negative pulses trailing the positive pulses) and these negative pulses may reset the circuits in these cells. The four phases may be derived from the two clocks: CLOCK 1 and CLOCK 2, which may also serve as AC power lines. CLOCK 1 and CLOCK 2 may have a phase difference of 90 degrees. In one example, cross-wired transformers (not shown) may be used to produce a four-phase clock from the two AC power lines. The four phases of the clock may provide directionality to the SFQ pulses. Thus, as an example, with respect to a four-phase clock, the positive pulse may ride the leading edge of the clock from one phase to the next and arrive at the output after one cycle of delay and the negative pulse may follow with half a cycle of separation.

Although FIG. 3 illustrates the operation of device 300 with a four-phase clock, device 300 may operate with higher number of phase clocks, e.g., an eight-phase clock (PHASE 0 corresponding to 0 degree, PHASE 1 corresponding to 45 degrees, PHASE 2 corresponding to 90 degrees, PHASE 3 corresponding to 135 degrees, PHASE 4 corresponding to 180 degrees, PHASE 5 corresponding to 225 degrees, PHASE 6 corresponding to 270 degrees, and PHASE 7 corresponding to 315 degrees). In addition, device 300 may also operate with a six-phase clock (PHASE 0 corresponding to 0 degree, PHASE 1 corresponding to 60 degrees, PHASE 2 corresponding to 120 degrees, PHASE 3 corresponding to 180 degrees, PHASE 4 corresponding to 240 degrees, PHASE 5 corresponding to 300 degrees. In this example, the gates of device 300 may be reset two phases after the respective gates process any inputs. In other words, the reset need not occur in response to a negative pulse trailing a positive pulse, but may occur during a later phase.

Although FIG. 3 shows a certain number of components of device 300 arranged in a certain manner, there could be more or fewer number of components arranged differently. As an example, although not shown, the AC power may be distributed to device 300 via microwave components, such as power splitters, matching networks, and phase shifters. Advantageously, the integration of RQL gates with such components may result in low power dissipation.

Figure 4:
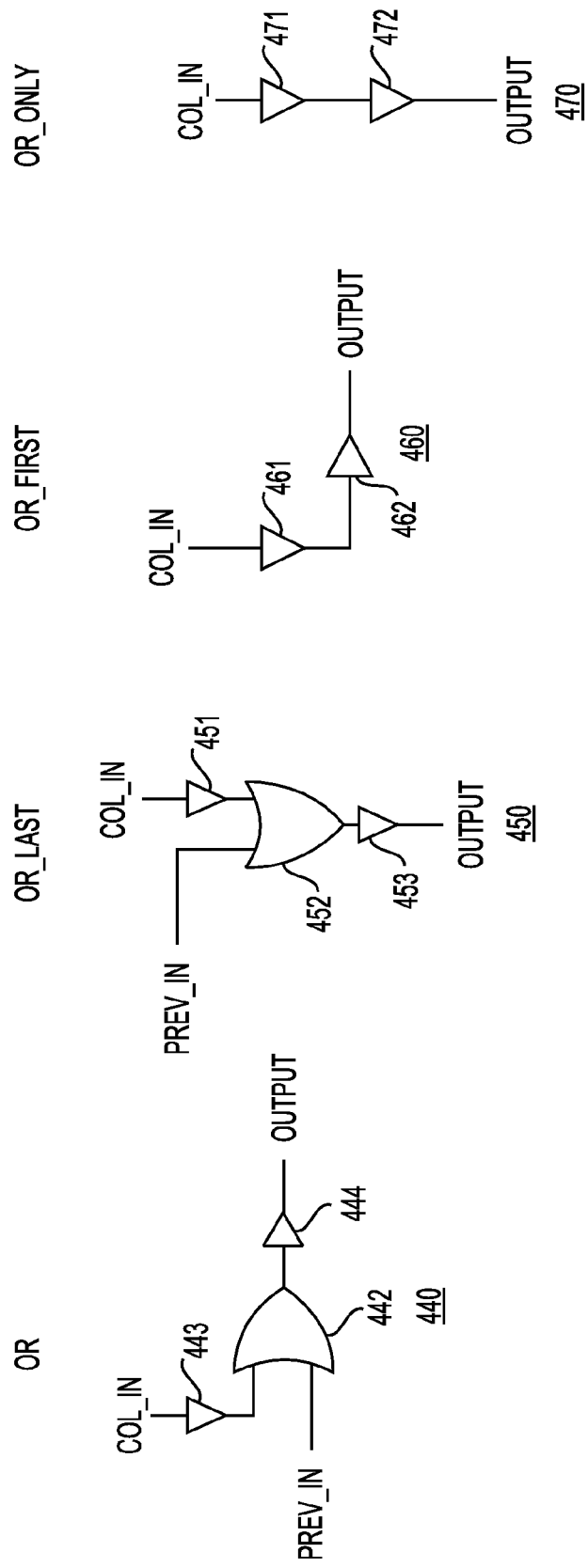
FIG. 4 shows schematic diagrams of superconducting logic cells used to sum the product terms in accordance with one example.

FIG. 4 shows schematic diagrams of superconducting logic cells used to sum the product terms in accordance with one example. Depending upon how many outputs are required to be generated by summing the product terms, superconducting logic cells placed at the bottom-most row of device 300 can be selected. As an example, referring back to FIG. 3, in device 300, three outputs (sum of product terms) are shown as being generated (OUTPUT[0], OUTPUT[1], and OUTPUT[2]). To generate these outputs, in one example, four different types of tiles (OR, OR_LAST, OR_FIRST, and OR_ONLY) for the superconducting logic cells can be selected. The four different types of tiles may differ in terms of the components that make up these tiles or may differ in layout only. As an example, OR tile 440 and OR_LAST tile 450 differ in layout only. Similarly, OR_FIRST tile 460 and OR_ONLY tile 470 differ in layout only. In one example, OR tile 440 may include an OR gate 442 and JTL elements 443 and 444. OR tile 440 may perform a logical OR operation on a signal received via the COL_IN line and the PREV_IN line. This operation may thus sum product terms received via these respective lines. OR_LAST tile 450 may include an OR gate 452 and JTL elements 451 and 453. OR tile 440 may perform a logical OR operation on a signal received via the COL_IN line and the PREV_IN line. This operation may thus sum product terms received via these respective lines. OR_FIRST tile 460 may include JTL elements 461 and 462. OR_FIRST tile 460 may simply pass the signal received via the COL_IN line to OUTPUT. OR_ONLY tile 470 may include JTL elements 471 and 472. OR_ONLY tile 470 may simply pass the signal received via the COL_IN line to OUTPUT.

Figure 5:
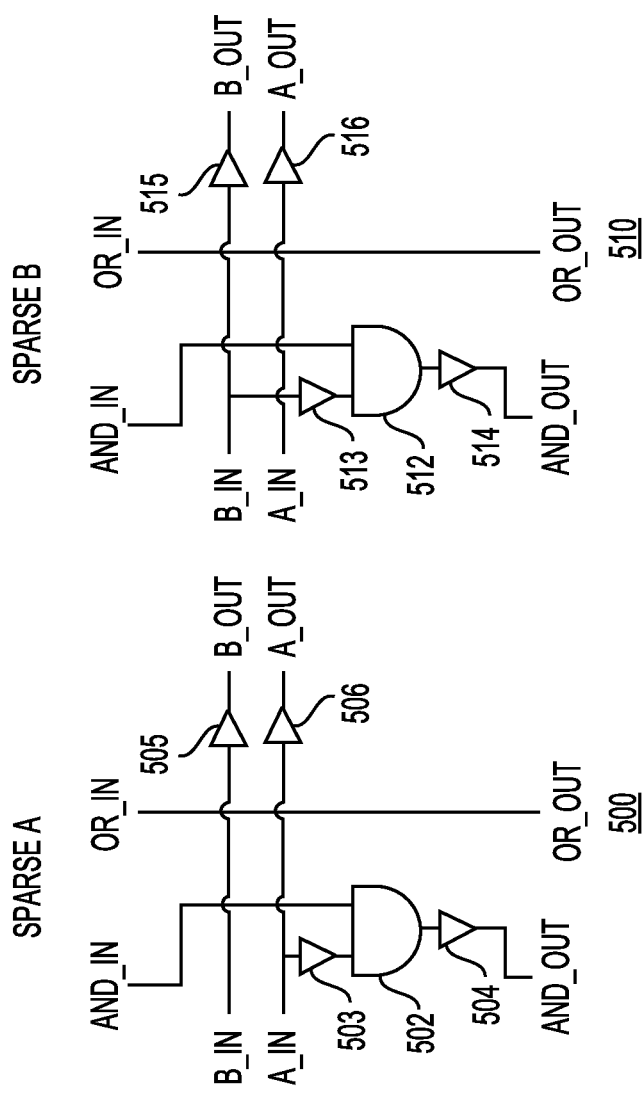
FIG. 5 shows schematic diagrams of superconducting logic cells in accordance with one example.
Figure 5:
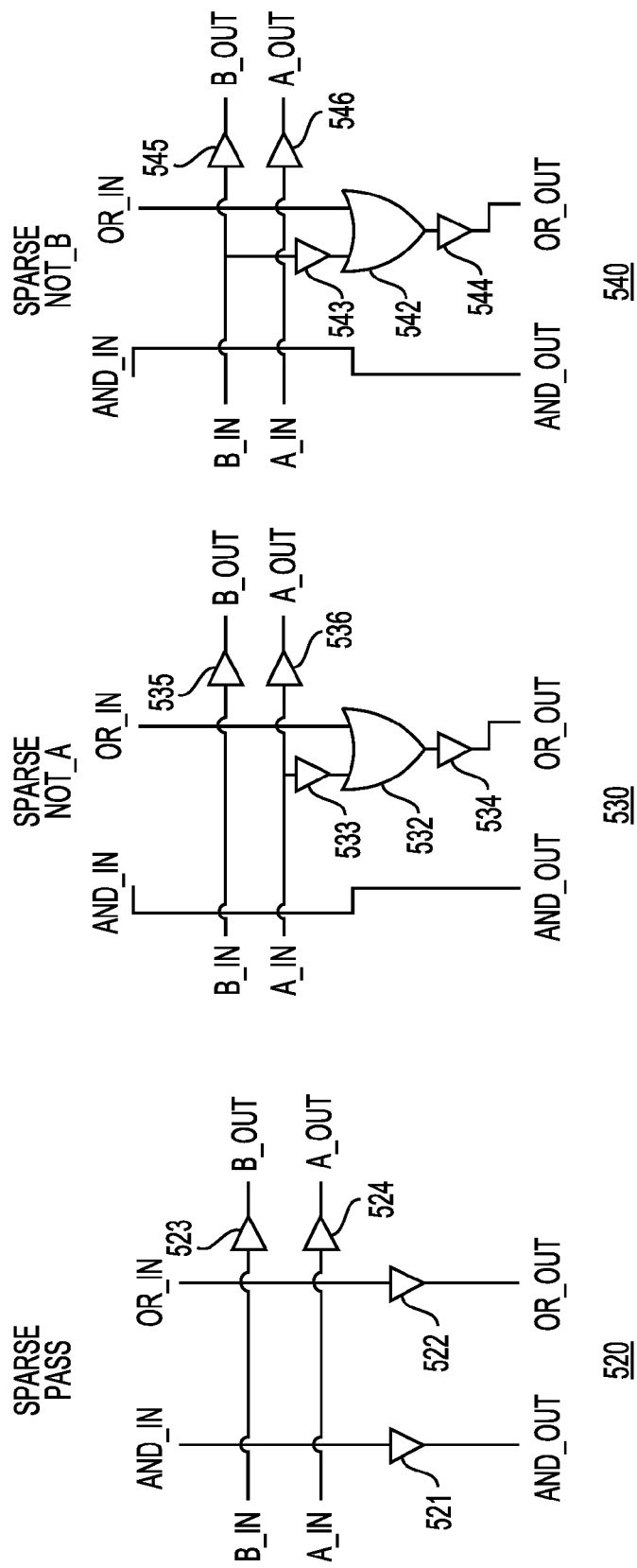

In one example, the arrays of superconducting logic cells shown as part of device 10 and device 300 may be enhanced to allow a faster and more compact layout. This may particularly be useful in scenarios where there are multiple outputs (e.g., product terms or sum of product terms), but the input terms are sparse. As an example, a sparse input may be one that appears only in a small number of product terms. In one example, two input lines may be provided per row and one or the other may be connected to an AND CONSOLIDATION line. If an input term is mutually exclusive with another in all product terms, then the two inputs may share a row and the size of the array may be reduced by one row. Additionally, even if an input is not mutually exclusive to another input in all of the product terms, but is mutually exclusive to at least one input in all of the product terms, it may be repeated in multiple shared input rows and thus still allow a reduction in the array size. FIG. 5 shows schematic diagrams of sparse superconducting logic cells in accordance with one example. SPARSE A tile 500 may be used to perform a logical AND operation on two inputs (e.g., A_IN and AND_IN). As shown in FIG. 5, it may receive B_IN as another input, but that input may not be coupled to the AND_IN line. Alternatively, as shown in SPARSE B tile 510, the B_IN input may be coupled to the AND_IN line, but not the A_IN input. SPARSE A tile 500 may include an AND gate 502 and Josephson transmission line (JTL) elements, such as 503, 504, 505, and 506. Although not shown, SPARSE A tile 500 may also include another JTL element between the OR_IN input and the OR_OUT output. In addition, any signals arriving at the tile from the left via the A_IN input may be passed to the right of the tile via the A_OUT output. JTL element 506 may be provided between the A_IN input and the A_OUT output. SPARSE B tile 510 may be used to perform a logical AND operation on two inputs (e.g., B_IN and AND_IN). As shown in FIG. 5, it may receive A_IN as another input, but that input may not be coupled to the AND_IN line. Alternatively, as shown in SPARSE A tile 500, the A_IN input may be coupled to the AND_IN line, but not the B_IN input. SPARSE B tile 510 may include an AND gate 512 and Josephson transmission line (JTL) elements, such as 513, 514, 515, and 516. Although not shown, SPARSE B tile 510 may also include another JTL element between the OR_IN input and the OR_OUT output. In addition, any signals arriving at the tile from the left via the B_IN input may be passed to the right of the tile via the B_OUT output. JTL element 516 may be provided between the B_IN input and the B_OUT output. The JTL elements may include Josephson junctions (JJs). They may be used to propagate SFQ pulses. Although FIG. 5 shows a certain number of components of SPARSE A tile 500 and SPARSE B tile 510 arranged in a certain manner, there could be more or fewer number of components arranged differently. For example, to meet certain timing requirements, if needed, SPARSE A tile 500 and SPARSE tile B 510 may include additional or fewer JTL elements.

With continued reference to FIG. 5, SPARSE PASS tile 520 may be used to pass: (1) a signal input at A_IN input to the right at A_OUT output without modifying the signal and (2) a signal input at B_IN input to the right at B_OUT output without modifying the signal. SPARSE PASS tile 520 may include Josephson transmission line (JTL) elements, such as 521, 522, 523, and 524. SPARSE PASS tile 520 may also simply allow signals received at the AND_IN input to pass through to the AND_OUT output. In addition, any signals arriving at the tile via the OR_IN input may be passed to the OR_OUT output. The JTL elements may include Josephson junctions (JJs). They may be used to propagate SFQ pulses. Although FIG. 5 shows a certain number of components of SPARSE PASS tile 520 arranged in a certain manner, there could be more or fewer number of components arranged differently. For example, to meet certain timing requirements, if needed, SPARSE PASS tile 520 may include additional or fewer JTL elements.

With continued reference to FIG. 5, SPARSE NOT_A tile 530 may be used to perform a logical OR operation on two inputs (e.g., A_IN and OR_IN). SPARSE NOT_A tile 530 may include an OR gate 532 and Josephson transmission line (JTL) elements, such as 533, 534, 535, and 536. Although not shown, SPARSE NOT_A tile 530 may also include another JTL element between the AND_IN input and the AND_OUT output. In addition, any signals arriving at the tile from the left via the A_IN input may be passed to the right of the tile via the A_OUT output. Alternatively, any signals arriving at the tile from the left via the B_IN input may be passed to the right of the tile via the B_OUT output. The JTL elements may include Josephson junctions (JJs). They may be used to propagate SFQ pulses. Although FIG. 5 shows a certain number of components of SPARSE NOT_A tile 530 arranged in a certain manner, there could be more or fewer number of components arranged differently. For example, to meet certain timing requirements, if needed, SPARSE NOT_A tile 530 may include additional or fewer JTL elements. SPARSE NOT_B tile 540 may be used to perform a logical OR operation on two inputs (e.g., B_IN and OR_IN). SPARSE NOT_B tile 540 may include an OR gate 542 and Josephson transmission line (JTL) elements, such as 543, 544, 545, and 546. Although not shown, SPARSE NOT_B tile 540 may also include another JTL element between the AND_IN input and the AND_OUT output. In addition, any signals arriving at the tile from the left via the B_IN input may be passed to the right of the tile via the B_OUT output. Alternatively, any signals arriving at the tile from the left via the A_IN input may be passed to the right of the tile via the A_OUT output. The JTL elements may include Josephson junctions (JJs). They may be used to propagate SFQ pulses. Although FIG. 5 shows a certain number of components of SPARSE NOT_B tile 540 arranged in a certain manner, there could be more or fewer number of components arranged differently. For example, to meet certain timing requirements, if needed, SPARSE NOT_B tile 540 may include additional or fewer JTL elements.

In one example, various types of tiles of superconducting logic cells described earlier may be part of a library of cells. Using a place and route tool, one could access the library of cells and efficiently place and route the cells to achieve the desired functionality based on the calculation of the various product terms or sum of product terms. The level of automation of such a process may vary depending upon the tool and its features. As an example, various input signals may be included either for performing logical AND operation on them using the appropriately placed tiles and the AND CONSOLIDATION line or for performing logical OR operation on them using the appropriated placed tiles and the OR CONSOLIDATION line. As discussed in earlier examples, because the superconducting logic cells are connected to each other via abutment, it may advantageously simplify the placement and routing of the superconducting logic cells for performing various calculations. The place and route process may advantageously be efficiently executed using a place and route tool. Similarly, floor planning of a device, such as device 10 and device 300 may advantageously be simplified.

Figure 6:
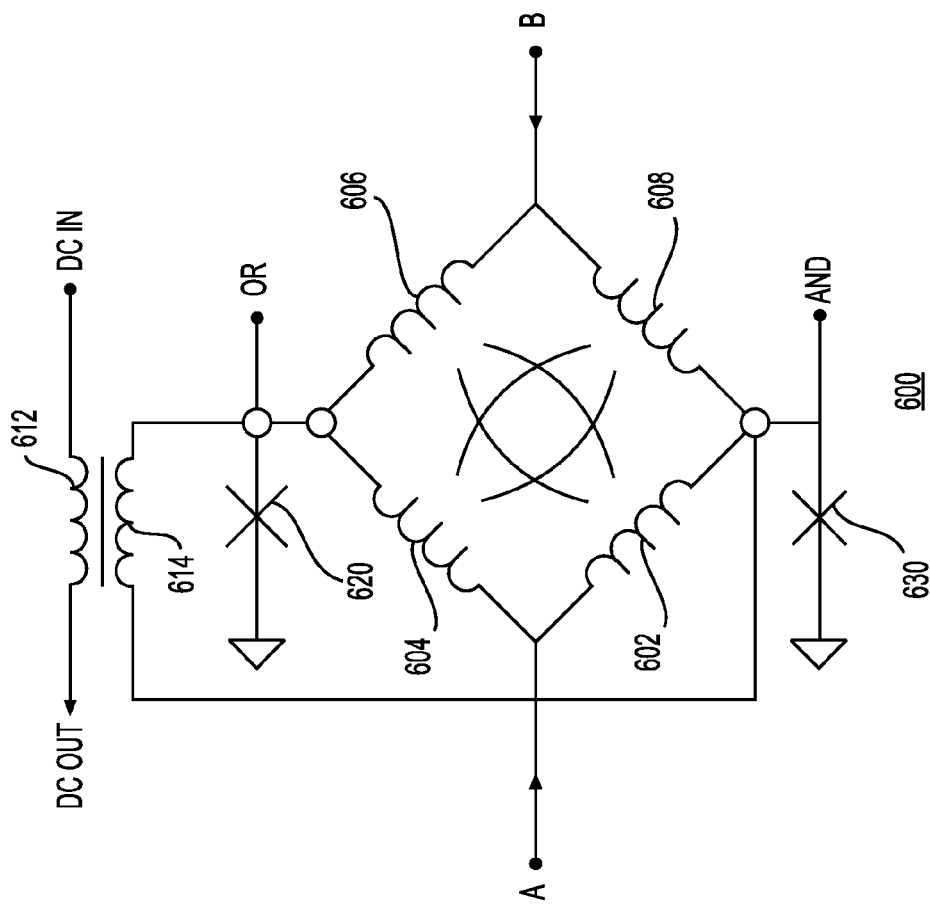
FIG. 6 shows a schematic diagram of an AND/OR gate in accordance with one example.

FIG. 6 shows a schematic diagram of an AND/OR gate 600 in accordance with one example. AND/OR gate 600 may provide each of the logical AND and the logical OR functions. AND/OR gate 600 may include a terminal A for receiving an input pulse, which may be coupled to one terminal of an inductor 602. The other terminal of inductor 602 may be coupled to one terminal of Josephson junction 630 and to a terminal for providing the AND output. The other terminal of Josephson junction 630 may be coupled to ground. AND/OR gate 600 may further include terminal B for receiving an input pulse, which may be coupled to one terminal of inductor 608. The other terminal of inductor 608 may be coupled to one terminal of Josephson junction 630 and to a terminal for providing the AND output. The terminal (A) for receiving an input pulse may further be coupled to one terminal of inductor 604. The other terminal of inductor 604 may be coupled to one terminal of Josephson junction 620 and to a terminal for providing the OR output. The other terminal of Josephson junction 620 may be coupled to ground. The terminal (B) for receiving an input pulse may further be coupled to one terminal of inductor 606. The other terminal of inductor 606 may be coupled to one terminal of Josephson junction 620 and to a terminal for providing the OR output. Additionally, a transformer coupling may exist between inductor 606 and inductor 602 and a transformer coupling may exist between inductor 608 and inductor 604. The terminal for providing the OR output may further be coupled to one terminal of inductor 614. The other terminal of inductor 614 may be coupled to the terminal for providing the AND output. An inductor 612 may be coupled between the DC IN terminal and the DC OUT terminal. The DC flux bias may be coupled via the transformer formed by inductors 612 and 614. Josephson junction 620 may be preferentially biased by the DC bias such that, when no input pulse arrives, current caused by one-half quantum of flux circulates through the storage loop formed by inductor 614 and Josephson junction 620. When the first input (e.g., a positive SFQ pulse) arrives at any of terminal A or terminal B, one-half quantum of flux may cause current flow through either inductor 604 or inductor 606, which in turn may "flip" Josephson junction 620 and thereby provide a positive pulse at the OR output. This positive pulse may also reverse the direction of the DC bias, preferentially biasing Josephson junction 630. After a second input (e.g., another positive SFQ pulse), a pulse may appear at the output terminal Q when Josephson junction 630 "flips," thus providing a logical AND function. If a positive SFQ pulse arrives at both terminal A and terminal B at about the same time, then the current (corresponding to one-half quantum of flux) flowing through inductor 602 and another current (corresponding to one-half of quantum of flux) flowing through inductor 608 may trigger Josephson junction 620. That, in turn, may produce a positive pulse at the AND output. In this manner, AND/OR gate 600 may perform both the OR logical function and the AND logical function. In addition, the presence of positive pulses at terminal A and terminal B may also correlated with an application of AC power with a particular phase in the surrounding JTL elements (not shown). Although FIG. 6 shows a certain number of components of AND/OR gate 600 arranged in a certain manner, there could be more or fewer number of components arranged differently. For example, as part of manufacturing device 10 or 300, AND/OR gate 600 may be formed using a multiple-metal layer process. As part of this process, superconductive material, such as Niobium, may be combined with insulating material, such as various types of dielectrics. In addition, although FIG. 6 shows a combined AND/OR gate, the AND logical function and the OR logical function may be performed using a dedicated AND gate and a dedicated OR gate, respectively. To create a dedicated AND gate, the OR output terminal may be removed and a terminating resistor may be placed in parallel with Josephson junction 620. Similarly, to create a dedicated OR gate, the AND output terminal may be removed and a terminating resistor may be placed in parallel with Josephson junction 630.

Figure 7:
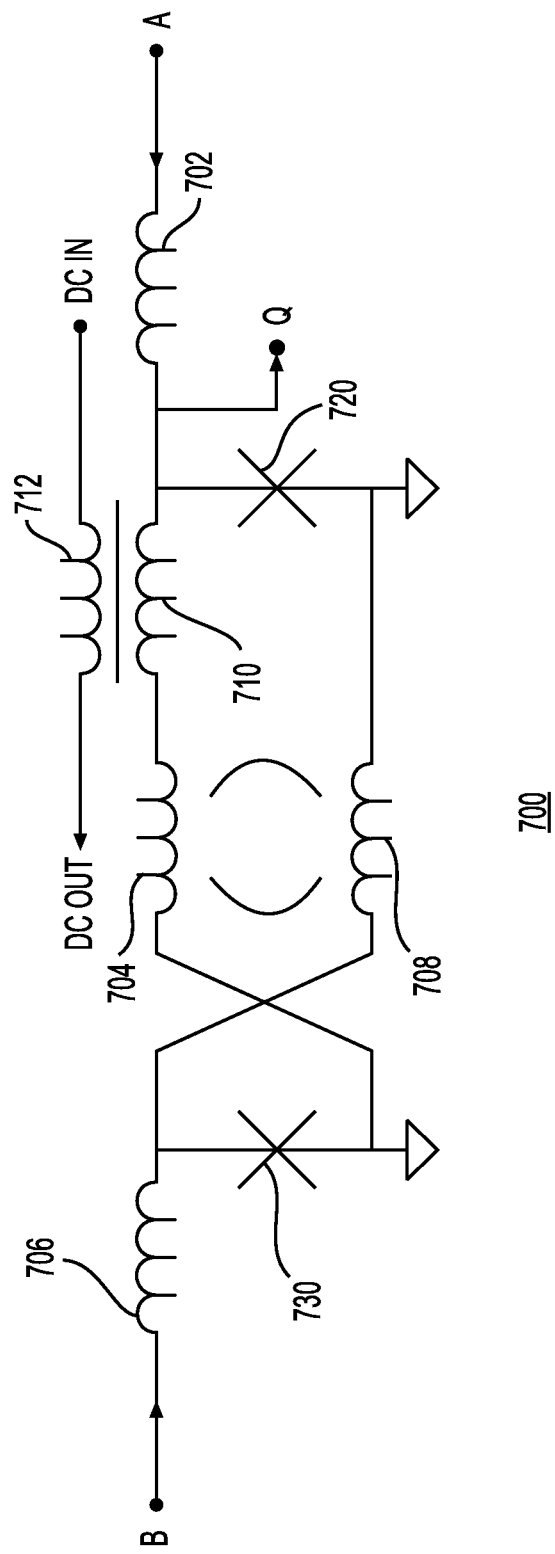
FIG. 7 shows a schematic diagram of an AanB gate in accordance with one example.

FIG. 7 shows a schematic diagram of an AanB gate 700 in accordance with one example. AanB gate 800 may implement an A-and-not-B function. In general, an input pulse received at the terminal A may propagate to output Q unless an input pulse at the terminal B comes first. An input pulse received via the terminal A may propagate to the output terminal (Q) when favorable clock conditions may be present on an output Josephson transmission line (JTL), unless an input pulse at the terminal B comes first with respect to either input pulse at the terminal A or the favorable clock conditions on an output JTL (not shown). In some instances, if the input pulse at the terminal B arrives after the input pulse at the terminal A, but before the favorable clock conditions at the output JTL, the input pulse at the terminal A may appear to propagate through the AanB gate; but may get stuck at the next JTL and then it may be suppressed before favorable clock conditions allow it to propagate. AanB gate 700 may include Josephson junctions 720 and 730. AanB gate may further include inductors 702, 704, 706, 708, 710, and 712. An input signal (e.g., a SFQ pulse) at the terminal A is received via inductor 702 and an input signal at the terminal B is received via inductor 706. Inductor 712 may be coupled between the DC IN terminal and the DC OUT terminal. The DC flux bias may be coupled via the transformer formed by inductors 712 and 710. Josephson junction 730 may be preferentially biased by the DC bias such that, when no input pulse arrives, current caused by one-half quantum of flux circulates through the storage loop formed by inductors 704, 708, and 710 (inductors 704 and 708 may be coupled via a transformer coupling) and Josephson junctions 720 and 730. When the first input pulse (e.g., a positive SFQ pulse) arrives at terminal A, one-half quantum of flux may cause current flow through inductor 702, which in turn may "flip" Josephson junction 730 and thereby provide a positive pulse at the output terminal (Q). If, however, an input pulse arrives first at terminal B, then that may "flip" Josephson junction 730 and reverse the current flow in the loop formed by inductors 704, 708, and 710, and Josephson junctions 720 and 730. If after the input pulse received at the terminal B, an input pulse arrives at the terminal A, an output pulse may not propagate to the output terminal (Q). This is because the quantum flux applied by the input pulse at, via the terminal A, may not be enough to counter the effect of the current flow in the storage loop biased by the DC bias. Although FIG. 7 shows a certain number of components of AanB gate 700 arranged in a certain manner, there could be more or fewer number of components arranged differently. For example, as part of manufacturing device 10 or 300, AanB gate 700 may be formed using a multiple-metal layer process. As part of this process, superconductive material, such as Niobium, may be combined with insulating material, such as various types of dielectrics.

Figure 8:
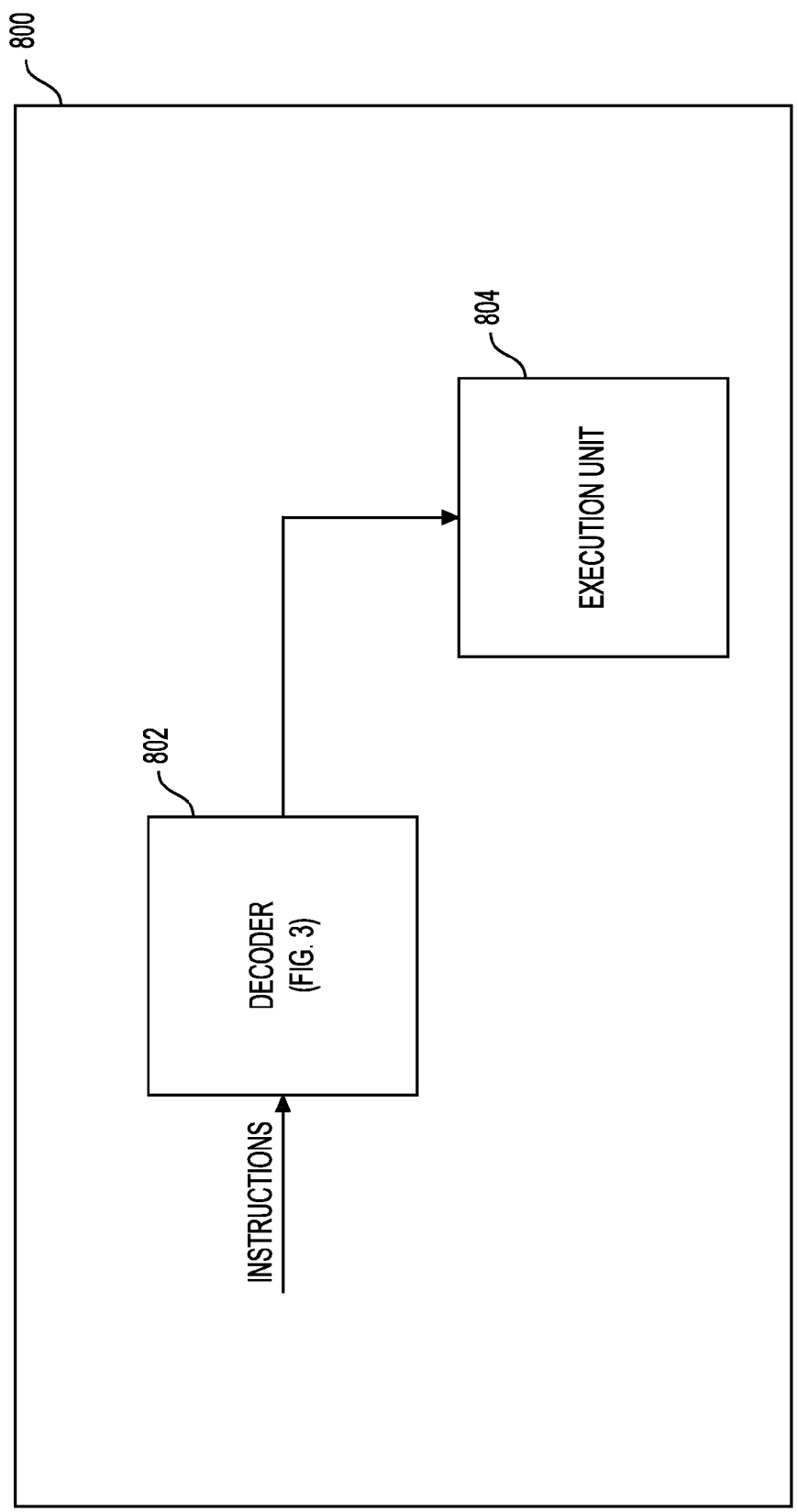
FIG. 8 shows a portion of a processor in accordance with one example.

FIG. 8 shows a portion of a processor 800 in accordance with one example. Processor 800 may include a decoder 802 and an execution unit 804. In one example, decoder 802 may act as control logic for processor 800 by decoding instructions or providing other type of processing associated with the instructions. In one example, decoder 802 may be based on one or more programmable logic arrays (PLAs), such as the one described earlier with respect to FIG. 3. Additionally, device 10 and device 300 may be used as part of control logic with other types of superconducting logic based devices. In general, any superconducting device operating in cryogenic environments and requiring control logic may include device 10 or device 300. Furthermore, execution unit 804 need not be in a cryogenic environment; instead, it may operate at non-cryogenic temperatures. In this example, decoder 802 may be in a separate cryogenic environment and may be coupled via connectors to execution unit 804 in a way that the cryogenic environment can be maintained. Processor 800 may be used as part of computing units in a data center for delivering cloud-based services, such as software as a service, platform as a service, or other services.

In conclusion, a device including a means for receiving a first clock having a first phase and a means for receiving a second clock having a second phase different from the first phase is provided. In one example, the means for receiving the first clock may be a first clock terminal and the means for receiving the second clock may be a second clock terminal. The device may further include means for receiving at least one input and for providing at least one output. In one example, the means for receiving and providing may be an array of superconducting logic cells. In one example, each of the superconducting logic cell may include a gate selected from a group consisting of an AND gate, an OR gate, and an AanB gate. In one example, the superconducting logic cell may be formed using reciprocal quantum logic circuits. In one example, the superconducting logic cell may include at least one Josephson junction configured to change its state based on at least one of: (1) a first biasing condition caused by the first phase of the first clock or (2) a second biasing condition caused by the second phase of the second clock. In addition, each of the superconducting logic cells may be arranged in a pre-determined location in the array. In one example, the device may further include a means for processing at least a first set of inputs during the first phase of the first clock at least in response to the first biasing condition to generate a first set of outputs. In one example, a first set of the superconducting logic cells in the array of the superconducting logic cells may be configured to perform this function. The device may further include a means for processing at least a second set of inputs during the second phase of the second clock at least in response to the second biasing condition. In one example, a second subset of the superconducting logic cells in the array of superconducting logic cells may be configured to perform this function.

The array of the superconducting logic cells may further be configured to perform at least one operation by processing at least one of the first set of inputs and the second set of inputs. In one example, the at least one operation may be performed based on a connection arrangement of the array of superconducting logic cells, where with respect to connections with other superconducting logic cells in the array of the superconducting logic cells, each of the superconducting logic cells may be connected only to adjacent superconducting logic cells in the array of the superconducting cells. In one example, with respect to the connections with the other superconducting logic cells in the array of the superconducting logic cells, each of the connections may be formed via an abutment. In one example, the device may further be configured as a means for decoding instructions or as a means for providing a programmable logic array functions.

In addition, a device including a means for receiving a first clock having a first phase, a means for receiving a second clock having a second phase different from the first phase, and a means for receiving a logic high signal is provided. In one example, the means for receiving the first clock may be a first clock terminal, the means for receiving the second clock may be a second clock terminal, and the means for receiving the logic high signal may be an input terminal. The device may further include means for receiving at least one input and for providing at least one output. In one example, the means for receiving and providing may be an array of superconducting logic cells. In one example, each of the superconducting logic cell may include a gate selected from a group consisting of an AND gate, an OR gate, and an AanB gate. In one example, the superconducting logic cell may be formed using reciprocal quantum logic circuits. In one example, the superconducting logic cell may include at least one Josephson junction configured to change its state based on at least one of: (1) a first biasing condition caused by the first phase of the first clock or (2) a second biasing condition caused by the second phase of the second clock. In addition, each of the superconducting logic cells may be arranged in a pre-determined location in the array. In one example, the device may further include a means for processing at least a first set of inputs during the first phase of the first clock at least in response to the first biasing condition to generate a first set of outputs. In one example, a first set of the superconducting logic cells in the array of the superconducting logic cells may be configured to perform this function. The device may further include a means for processing at least a second set of inputs during the second phase of the second clock at least in response to the second biasing condition. In one example, a second subset of the superconducting logic cells in the array of superconducting logic cells may be configured to perform this function.

The array of the superconducting logic cells may further be configured to perform at least one operation by processing at least one of the first set of inputs and the second set of inputs. In one example, the first set of inputs and the second set of inputs may include at least one of a plurality of inverted terms or a plurality of non-inverted terms. Based on a connection arrangement of the array of the superconducting logic cells, the plurality of the inverted terms may be combined using a logical OR operation and the plurality of the non-inverted terms and the logic high signal may be combined using a logical AND operation. The device may further include a means for consolidating the non-inverted terms and a means for consolidating the inverted terms. In one example, the means for consolidating the non-inverted terms may be an AND CONSOLIDATION line and the means for consolidating the inverted terms may be an OR CONSOLIDATION line. In one example, with respect to the connections with the other superconducting logic cells in the array of the superconducting logic cells, each of the superconducting logic cells is connected only to directly adjacent superconducting logic cells in the array of the superconducting cells and each of the connections may be formed via an abutment. In one example, the device may further be configured as a means for decoding instructions or as a means for providing a programmable logic array functions.

In another example, a method for in a device including: (a) a first clock terminal for receiving a first clock having a first phase, (b) a second clock terminal for receiving a second clock having a second phase different from the first phase, (c) and an array of superconducting logic cells, where each of the superconducting logic cells may be configured to receive at least one input and provide at least one output, and where each of the superconducting logic cells comprises at least one Josephson junction configured to change its state based on at least one of: (1) a first biasing condition caused by the first phase of the first clock or (2) a second biasing condition caused by the second phase of the second clock, and where each of the superconducting logic cells is arranged in a pre-determined location in the array, is provided. The method may include processing, using a first subset of the superconducting logic cells in the array of superconducting logic cells, at least a first set of inputs during the first phase of the first clock at least in response to the first biasing condition to generate a first set of outputs. The method may further include processing, using a second subset of the superconducting logic cells in the array of superconducting logic cells, at least a second set of inputs during the second phase of the second clock at least in response to the second biasing condition. The method may further include performing at least one logical operation by processing at least one of the first set of inputs and the second set of inputs, where the first set of inputs and the second set of inputs may include at least one of a plurality of inverted terms or a plurality of non-inverted terms, and where the performing the at least one logical operation may further include combining the plurality of inverted terms using at least one OR gate and combining the plurality of non-inverted terms using at least one AND gate to generate at least one product term. The method may further include outputting the at least one product term using at least one AanB gate. The method may further include consolidating the plurality of non-inverted terms using a first signal line and consolidating the plurality of inverted terms using a second signal line. The method may further include configuring the device as a programmable logic array or a decoder.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 800, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A device comprising:
   a first clock terminal for receiving a first clock having a first phase;
   a second clock terminal for receiving a second clock having a second phase different from the first phase; and
   an array of superconducting logic cells, wherein each of the superconducting logic cells is configured to receive at least one input and provide at least one output, and wherein each of the superconducting logic cells comprises at least one Josephson junction configured to change its state based on at least one of: (1) a first biasing condition caused by the first phase of the first clock or (2) a second biasing condition caused by the second phase of the second clock, and wherein each of the superconducting logic cells is arranged in a pre-determined location in the array, and wherein a first set of the superconducting logic cells in the array of the superconducting logic cells is configured to process at least a first set of inputs during the first phase of the first clock at least in response to the first biasing condition to generate a first set of outputs and a second subset of the superconducting logic cells in the array of superconducting logic cells is configured to process at least a second set of inputs during the second phase of the second clock at least in response to the second biasing condition, and wherein the array of the superconducting cells is configured to perform at least one operation by processing at least one of the first set of inputs and the second set of inputs, and wherein the at least one operation is performed based on a connection arrangement of the array of superconducting logic cells, wherein with respect to connections with other superconducting logic cells in the array of the superconducting logic cells, each of the superconducting logic cells is connected only to adjacent superconducting logic cells in the array of the superconducting logic cells, and wherein each of the superconducting logic cells comprises a gate selected from a group consisting of an AND gate, an OR gate, and an AanB gate.

2. The device of claim 1, wherein the device is configured as a programmable logic array.

3. The device of claim 1, wherein with respect to the connections with the other superconducting logic cells in the array of the superconducting logic cells, each of the connections is formed via an abutment.

4. The device of claim 1, wherein each of the superconducting logic cells is formed using reciprocal quantum logic circuits.

5. The device of claim 1, wherein the device is configured as a decoder.

6. The device of claim 1, wherein the first set of the inputs and the second set of the inputs comprise at least one of a plurality of inverted terms or a plurality of non-inverted terms, and the device further comprising a first signal line for consolidating the plurality of the non-inverted terms and a second signal line for consolidating the plurality of the inverted terms.

7. A device comprising:
   a first clock terminal for receiving a first clock having a first phase;
   a second clock terminal for receiving a second clock having a second phase different from the first phase;
   an input terminal for receiving a logic high signal; and
   an array of superconducting logic cells, wherein each of the superconducting logic cells is configured to receive at least one input and provide at least one output, and wherein each of the superconducting logic cells comprises at least one Josephson junction configured to change its state based on at least one of: (1) a first biasing condition caused by the first phase of the first clock or (2) a second biasing condition caused by the second phase of the second clock, and wherein each of the superconducting logic cells is arranged in a pre-determined location in the array, and wherein a first set of the superconducting logic cells in the array of the superconducting logic cells is configured to process at least a first set of inputs during the first phase of the first clock at least in response to the first biasing condition to generate a first set of outputs and a second subset of the superconducting logic cells in the array of superconducting logic cells is configured to process at least a second set of inputs during the second phase of the second clock at least in response to the second biasing condition, and wherein the first set of inputs and the second set of inputs comprise at least one of a plurality of inverted terms or a plurality of non-inverted terms, and wherein, based on a connection arrangement of the array of the superconducting logic cells, the plurality of the inverted terms are combined using a logical OR operation and the plurality of the non-inverted terms and the logic high signal are combined using a logical AND operation.

8. The device of claim 7, wherein with respect to connections with other superconducting logic cells in the array of the superconducting logic cells, each of the superconducting logic cells is connected only to directly adjacent superconducting logic cells in the array of the superconducting logic cells.

9. The device of claim 8, wherein with respect to the connections with the other superconducting logic cells in the array of the superconducting logic cells, each of the connections is formed via an abutment.

10. The device of claim 7 further comprising a first signal line for consolidating the non-inverted terms and a second signal line for consolidating the inverted terms.

11. The device of claim 7, wherein the device is configured as a programmable logic array.

12. The device of claim 7, wherein each of the superconducting logic cells is formed using reciprocal quantum logic circuits.

13. The device of claim 7, wherein the device is configured as a decoder.

14. A method in a device comprising a first clock terminal for receiving a first clock having a first phase, a second clock terminal for receiving a second clock having a second phase different from the first phase, and an array of superconducting logic cells, wherein each of the superconducting logic cells is configured to receive at least one input and provide at least one output, and wherein each of the superconducting logic cells comprises at least one Josephson junction configured to change its state based on at least one of: (1) a first biasing condition caused by the first phase of the first clock or (2) a second biasing condition caused by the second phase of the second clock, and wherein each of the superconducting logic cells is arranged in a pre-determined location in the array, the method comprising:
   processing, using a first subset of the superconducting logic cells in the array of superconducting logic cells, at least a first set of inputs during the first phase of the first clock at least in response to the first biasing condition to generate a first set of outputs;

processing, using a second subset of the superconducting logic cells in the array of superconducting logic cells, at least a second set of inputs during the second phase of the second clock at least in response to the second biasing condition;

performing at least one logical operation by processing at least one of the first set of inputs and the second set of inputs, wherein the first set of inputs and the second set of inputs may include at least one of a plurality of inverted terms or a plurality of non-inverted terms, and wherein the performing the at least one logical operation further comprises combining the plurality of inverted terms using at least one OR gate and combining the plurality of non-inverted terms using at least one AND gate to generate at least one product term; and outputting the at least one product term using at least one AanB gate.

15. The method of claim 14, wherein with respect to connections with other superconducting logic cells in the array of the superconducting logic cells, each of the superconducting logic cells is connected only to directly adjacent superconducting logic cells in the array of the superconducting logic cells.

16. The method of claim 15, wherein with respect to the connections with the other superconducting logic cells in the array of the superconducting logic cells, each of the connections is formed via an abutment.

17. The method of claim 14 further comprising consolidating the plurality of non-inverted terms using a first signal line and consolidating the plurality of inverted terms using a second signal line.

18. The method of claim 14 further comprising configuring the device as a programmable logic array.

19. The method of claim 14, wherein each of the superconducting logic cells is formed using reciprocal quantum logic circuits.

20. The method of claim 14 further comprising configuring the device as a decoder.

* * * * *